(12) United States Patent
Kotzabasakis et al.

(10) Patent No.: US 9,646,117 B1
(45) Date of Patent: May 9, 2017

(54) ACTIVATED WORKFLOW

(71) Applicant: Aspen Technology, Inc., Burlington, MA (US)

(72) Inventors: Manolis Kotzabasakis, Hopkinton, MA (US); Ashok R. Subramanian, Cambridge, MA (US); Vikas Dhole, Medway, MA (US)

(73) Assignee: Aspen Technology, Inc., Bedford, MA (US)

( * ) Notice: Subject to any disclaimer, the term of this patent is extended or adjusted under 35 U.S.C. 154(b) by 741 days.

(21) Appl. No.: 14/101,216

(22) Filed: Dec. 9, 2013

Related U.S. Application Data (60) Provisional application No. 61/734,961, filed on Dec. 7, 2012.

(51) Int. Cl.
*G06F 17/50* (2006.01)
*G06Q 10/06* (2012.01)

(52) U.S. Cl.
CPC ..... *G06F 17/5009* (2013.01); *G06Q 10/0633* (2013.01)

(58) Field of Classification Search
CPC ................................................. G06Q 10/0633
USPC ......................................................... 703/22
See application file for complete search history.

(56) References Cited

U.S. PATENT DOCUMENTS

| | | |
|---|---|---|
| D403,673 S | 1/1999 | Arora et al. |
| D420,995 S | 2/2000 | Imamura et al. |
| D451,928 S | 12/2001 | Van Huong |
| D454,138 S | 3/2002 | Imamura et al. |
| D462,695 S | 9/2002 | Nguyen Van Huong |
| D500,766 S | 1/2005 | Hanisch et al. |
| D592,223 S | 5/2009 | Neuhaus |
| D593,120 S | 5/2009 | Bouchard et al. |
| D598,468 S | 8/2009 | Hirsch et al. |
| D606,091 S | 12/2009 | O'Donnell et al. |

(Continued)

OTHER PUBLICATIONS

Altair HyperStudy; 137 pp.; 2009; obtained from http://blog.altair.co.kr/wp-content/uploads/2011/03/hyperstudy_10-0.pdf.*

(Continued)

*Primary Examiner* — Hugh Jones
(74) *Attorney, Agent, or Firm* — Hamilton, Brook, Smith & Reynolds, P.C.

(57) ABSTRACT

Activated workflow engine, system and method are configured for simulation modeling and an integrated suite of relevant applications. The workflow engine pre-configures workflows of the simulation modeling application. When an end user performs a transaction in the simulation model, the necessary and sufficient information is gathered automatically from the context of the transaction. From the gathered information, the activated workflow engine matches appropriate variables and assigns input values to suit the workflows which are applicable to the transaction. This facilitates the ability to invoke multiple workflows associated with this transaction and subsequently validates the "activated state" of these workflows. When the underlying simulation model or the main transaction is executed, the workflows are activated, the input variables get populated, and the independent workflows get invoked automatically (without requiring manual further input). Results of invoked workflows are available and accessible by users anywhere, anytime.

21 Claims, 12 Drawing Sheets

(56) References Cited

U.S. PATENT DOCUMENTS

| | | | |
|---|---|---|---|
| D607,007 S | 12/2009 | Kocmick | |
| 7,627,694 B2 | 12/2009 | Sreenivasan et al. | |
| D614,192 S | 4/2010 | Takano et al. | |
| D624,928 S | 10/2010 | Agnetta et al. | |
| D628,584 S | 12/2010 | Umezawa | |
| D629,410 S | 12/2010 | Ray et al. | |
| D657,377 S | 4/2012 | Vance et al. | |
| D658,204 S | 4/2012 | Jones | |
| D660,313 S | 5/2012 | Williams et al. | |
| D661,369 S | 6/2012 | Nelson | |
| D674,405 S | 1/2013 | Guastella et al. | |
| D678,320 S | 3/2013 | Kanalakis, Jr. et al. | |
| D678,894 S | 3/2013 | Kanalakis, Jr. et al. | |
| D678,895 S | 3/2013 | Ebler et al. | |
| D681,663 S | 5/2013 | Phelan et al. | |
| D681,664 S | 5/2013 | Phelan et al. | |
| D681,667 S | 5/2013 | Phelan | |
| D682,293 S | 5/2013 | Kanalakis, Jr. et al. | |
| D682,847 S | 5/2013 | Gardner et al. | |
| D682,866 S | 5/2013 | Peters et al. | |
| D687,063 S | 7/2013 | Myung et al. | |
| D688,692 S | 8/2013 | Tanghe et al. | |
| D691,160 S | 10/2013 | Schupp et al. | |
| D694,257 S | 11/2013 | McKinley et al. | |
| D698,816 S | 2/2014 | Phelan et al. | |
| D699,746 S | 2/2014 | Pearson et al. | |
| D700,208 S | 2/2014 | Phelan et al. | |
| D704,207 S | 5/2014 | Lee et al. | |
| D704,733 S | 5/2014 | Jewitt | |
| D706,828 S | 6/2014 | Hollobaugh | |
| D709,077 S | 7/2014 | Jonsson et al. | |
| 8,788,068 B2 | 7/2014 | Kocis et al. | |
| D710,892 S | 8/2014 | Hollobaugh et al. | |
| D722,075 S | 2/2015 | Zhang et al. | |
| D726,214 S | 4/2015 | Wantland et al. | |
| D729,836 S | 5/2015 | Lee | |
| D730,388 S | 5/2015 | Rehberg et al. | |
| D730,394 S | 5/2015 | Bray | |
| D730,397 S | 5/2015 | Oh et al. | |
| D730,932 S | 6/2015 | Kim et al. | |
| D730,952 S | 6/2015 | Siboni et al. | |
| D731,521 S | 6/2015 | Heo et al. | |
| D731,525 S | 6/2015 | Myers | |
| 9,046,881 B2 | 6/2015 | Blevins et al. | |
| D737,299 S | 8/2015 | Hisada et al. | |
| D737,321 S | 8/2015 | Lee | |
| D750,123 S | 2/2016 | Subramanian et al. | |
| 9,354,776 B1 | 5/2016 | Subramanian et al. | |
| 9,442,475 B2 | 9/2016 | Subramanian et al. | |
| 2002/0194324 A1 | 12/2002 | Guha | |
| 2009/0076681 A1 | 3/2009 | Yasue et al. | |
| 2010/0088654 A1 | 4/2010 | Henhoeffer | |
| 2010/0332273 A1 | 12/2010 | Balasubramanian et al. | |
| 2012/0029661 A1 | 2/2012 | Jones et al. | |
| 2013/0339100 A1 | 12/2013 | Warrick et al. | |
| 2014/0267425 A1 | 9/2014 | Moll et al. | |
| 2014/0330542 A1 | 11/2014 | Subramanian et al. | |
| 2014/0330783 A1 | 11/2014 | Provencher et al. | |
| 2014/0379112 A1 | 12/2014 | Kocis et al. | |
| 2015/0244884 A1 | 8/2015 | Sensu et al. | |

OTHER PUBLICATIONS

Mathur, Abhinav, "Failure Handling in YARN-Map Reduce v2," Jan. 30, 2013, 1 page.

Murthy, Arun, "Apache Hadoop YARN—Concepts and Applications," Hortonworks, Aug. 15, 2012, 13 pages.

Kumar Vavilapalli, Vinod, "Apache Hadoop YARN—ResourceManager," Hortonworks, Aug. 31, 2012, 12 pages.

"AspenTech Announces Availability of aspenOne® V8 Process Optimization Software", Dec. 10, 2012, PDF downloaded from http://www.aspentech.com/_ThreeColumnLayout.aspx?pageid=2147485680&id=15032387367, (3 pages) on Mar. 11, 2014.

"AspenTech Brings Search and High Performance Trending to Manufacturing Execution Systems with New Release of Aspen InfoPlus.21® Software", Mar. 6, 2012, PDF downloaded from http://www.aspentech.com/_ThreeColumnLayout.aspx?pageid=2147485680&id=15032385728, (2 pages) on Apr. 29, 2013.

"New Assay Management Functionality in Aspen PIMS™ Software Optimizes Crude Purchasing Decisions and Increases Profitability", Aug. 27, 2012, PDF downloaded from http://www.aspentech.com/_ThreeColumnLayout.aspx?pageid=2147485680&id=15032386682, (2 pages) on Mar. 11, 2014.

"New Release of Aspen Plus® Software Delivers an Innovative New Interface and Opens Process Simulation to a Wider Range of New Users", Mar. 6, 2012, PDF downloaded from http://www.aspentech.com/_ThreeColumnLayout.aspx?pageid=2147485680&id=15032385734, (3 pages) on Apr. 29, 2013.

"New Release of Aspen PIMS™ and Aspen Petroleum Scheduler™ Software Improves Collaboration Between Refining Planners and Schedulers", Mar. 6, 2012, PDF downloaded from http://www.aspentech.com/_ThreeColumnLayout.aspx?pageid=2147485680&id=15032385732, (2 pages) on Apr. 29, 2013.

"New Release of aspenONE® Software Enables Process Engineers to Display Real-Time Data on Simulation Flowsheets for the First Time", May 14, 2012, PDF downloaded from http://www.aspentech.com/_ThreeColumnLayout.aspx?pageid=2147485680&id=15032386067, (2 pages) on Apr. 29, 2013.

"Version 8.4 of aspenONE® Software Expands Activation Capability to Optimize Energy, Economics, and Heat Exchanger Designs", Nov. 25, 2013, PDF downloaded from http://www.aspentech.com/_ThreeColumnLayout.aspx?pageid=2147485680&id=15032390879, (3 pages) on Mar. 11, 2014.

Hughes, J., "What is a Microsoft Failover Cluster Virtual Adapter anyway?," dated Feb. 13, 2009, 18 pages, retrieved from https://web.archive.org/web/20160810142046/https://blogs.technet.microsoft.com/askcore/2009/02/13/what-is-a-microsoft-failover-cluster-virtual-adapter-anyway/.

Wikipedia, "Element (mathematics)," archived definition dated Nov. 28, 2012, 3 pages, retrieved from https://en.wikipedia.org/w/index.php?title=Element_(mathematics)&oldid=525288249relevant?.

Hashiguchi, et al., "Wide-area Integrated SCADA System Designed to Improve Availability and Flexibility," Hitachi Review, vol. 60 (2011), No. 7, p. 399-403.

When is multi-threading not a good idea? Sep. 2008. Retrieved from the Internet URL: http://stackoverflow.com/questions/93834/when-is-multi-threading-not-a-good-idea.

Pillai, et al., "Development of Supervisory Control and Data Acquisition system for Laboratory Based Mini Thermal Power Plan using LabVIEW", International Journal of Emerging Technology and Advanced Engineering, (ISSN 2250-2459, vol. 2, Issue 5, pp. 449-453, May 2012).

Meeks, Hutson, BPPM Self Monitoring Core Components—How-To Video Series, Mar. 30, 2012, downloaded from https://communities.bmc.com/docs/DOC-18939.

Notice of Allowance and Fee(s) Due for U.S. Appl. No. 13/931,715, "Method and System for Stateful Recovery and Self-Healing," date mailed, Dec. 21, 2016, 39 pp.

* cited by examiner

ACTIVATED WORKFLOW

RELATED APPLICATION

This application claims the benefit of U.S. Provisional Application No. 61/734,961 filed on Dec. 7, 2012. The entire teachings of the above application are incorporated herein by reference.

BACKGROUND OF THE INVENTION

Traditionally, a workflow is a depiction of a sequence of operations, declared as work of a person, a group of persons, an organization of staff, or one or more simple or complex mechanisms. The simulation modeling application has a significant number of mission critical workflows. These workflows are usually triggered manually.

SUMMARY OF THE INVENTION

Embodiments of the present invention provide an activated workflow engine (apparatus) and method. Applicant's activated workflows are specific to the world of simulation modeling and its integrated suite of relevant applications.

The simulation modeling application has a significant number of mission critical workflows. These workflows are usually triggered manually. The present invention introduces a mechanism to pre-configure these workflows starting with seeding appropriate input parameters or input variables. The pre-configured (seeded) workflow then sets the stage for the subsequent steps of the workflow. When an end user performs a transaction in the simulation model, sometimes referred to as a performing transaction, embodiments are able to automatically gather the necessary and sufficient information from the context of the simulation model transaction. Then, from the gathered information, embodiments match appropriate variables and parameters to respective input variables/input parameters of the workflows and assign the relevant input variables values and input parameters values to suit the respective workflows which are applicable to the transaction.

The above mechanisms facilitate the ability to invoke multiple workflows associated with a subject simulation model transaction and subsequently validates the "activated state" of these workflows. When the underlying simulation model or the main transaction gets executed, embodiments activate the workflows, meaning the input variables and input parameters get populated, and the individually independent workflows get invoked automatically. No user intervention to initialize the workflow and no manual input by the user to invoke the workflow is required (necessary). As results (output) of the invoked workflows become available, the invention system enables users to fetch the results anywhere, anytime.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 2 and 11 are schematic views of an example activated workflow for energy analytics in the embodiment of FIG. 1.

FIGS. 3 and 12 are schematic views of another example activated workflow for economics analysis in the embodiment of FIG. 1.

DETAILED DESCRIPTION OF THE INVENTION

A description of example embodiments of the invention follows.

The teachings of all patents, published applications and references cited herein are incorporated by reference in their entirety.

For the purposes of this invention, the workflow is defined as a set of one or more sequential and inter-connected simple or complex steps or mechanisms. The important aspect of this workflow is its automated and activated nature. The automation of all steps facilitates the art of executing business critical workflow. The automated steps may include seeding the appropriate variables as input parameters and input variables, ordering the sequence of steps, as well as mapping the workflow schema, and then associating the workflow schematics with specific use cases. In embodiments, the invention (system, method and apparatus) relate to a computer simulation modeling method.

The one or more workflows 15 can be pre-configured by seeding variables as input parameters and input variables in respective workflows. In embodiments, a first step of the activated workflow engine 100 of the invention is to pre-configure (including assign to) the proper input variables with sensible defaults and other relevant variable values (or thresholds) along with input parameters from the context of the underlying transaction (i.e., simulation model 13 transaction). In some embodiments, the context of the underlying transaction depends on the current state of the simulation/modeling application system 13. The activated workflow engine 100 preconfigures or otherwise assigns seed variables to the input variables and input parameters of various workflows 15 based on one or more of the following: simulation model 13 context, engine stored data 94, business logic of the engine routine 92, and rules built into the engine routine 92. In embodiments, the user can modify one or more sensible default or seeded variables for a particular workflow 15. In some embodiments, input variables and input parameters are not visible to the user and Engine 100 automatically matches and/or assigns to these input variables/input parameters based on the context of the underlying simulation model 13 transaction and the business logic of the simulation being modeled. In some embodiments, engine 100 may call or import workflow input variables and input parameters (definitions and/or values) from an external source.

A second step in the activated workflow engine 100 of the invention is to define the applicable workflow 15 from independent applications 23 that are integrated into the main simulation modeling application 13. Then the sequence of steps that form each of the workflows 15 is made to run in parallel, where for each workflow one step of the workflow feeds the data and functional flow to the next step of that workflow. In some embodiments, the one or more applications 23 integrated into the main simulation modeling application 13 are modular. In some embodiments the main simulation modeling application 13 is modular.

At this stage, Engine 100 associates the relevant workflows 15 with the main simulation modeling application 13. Then the invention system 100 validates the workflows 15 and puts the validated workflows 15 in ready to run mode. This is the "activated state" of the workflows 15. In some embodiments, the activated workflows 15 (Engine 100) populate default values or values from the seed variables triggered by rules, logic code, or business logic. In some embodiments, as the workflow progresses, additional variables (values for) are populated. In embodiments, invocation of the activated workflows 15 is triggered by certain respective user action.

When the transaction on the main simulation modeling application 13 runs, a processor initiates or launches the individual workflows 15 in parallel and the results are made available (e.g., displayed or output) to users. In a user-interface, the user obtains the results (respective executed workflows 15) by clicking on or otherwise selecting the appropriate icon on the dashboard (GUI area) that lists the activated workflows 15 that are applicable and pre-associated with the main simulation model 13 transaction.

Figure 1:
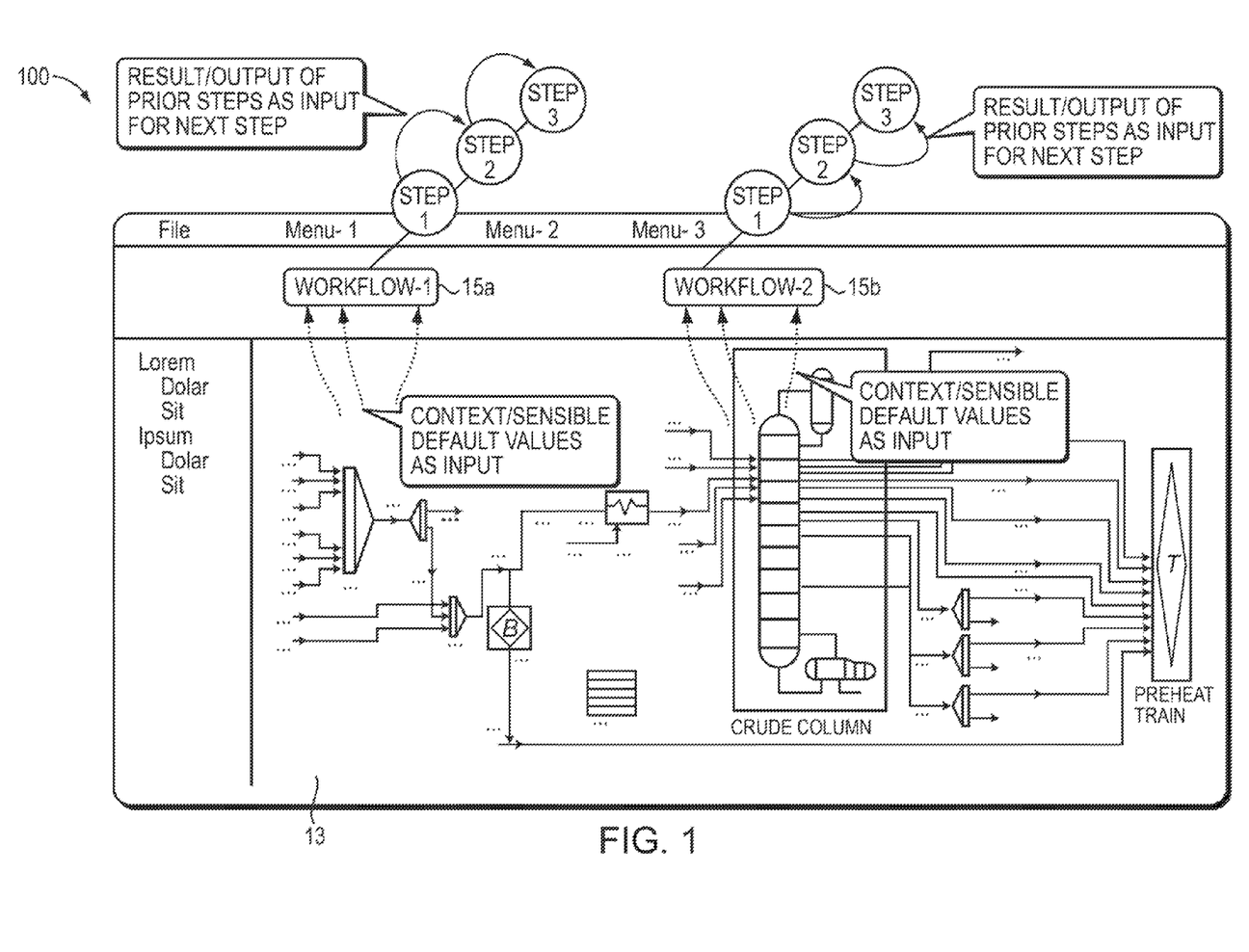
FIG. 1 is a schematic view of a simulation modeling system 100 having activated workflow engine and methods embodying the present invention.

FIG. 1 depicts the high level architecture of how the main simulation modeling application 13 and the associated workflows are 15a, b . . . n (generally 15) are integrated with each other in a simulation modeling system 100. Activated workflow engine 100 implements and supports the inventive features of system 100 (and thus are synonymously referenced as 100 herein). Each workflow 15 has a respective set or sequence of steps. In the sequence, output of one step serves or feeds as input (data and flow of control) to a succeeding step. In some embodiments, each workflow 15 is a respective set of one or more interconnected steps or mechanisms. The activated workflow engine 100 pre-configures each workflow 15 by seeding variables or setting context/sensible default values as input parameters in respective workflows 15.

Some of the benefits of activated workflow 15 are given below:

1. Elevate the business values provided by the application: Elevate the business value provided by the system 100 without which the customers would not know the existence of such capability at all.
2. Seemless Integration of business critical functionality: These activated workflows 15 help the system 100 integrate with other related functionalities which are not an integral part of the main simulation modeling application 13.
3. Ready-made Workflows: Embodiments provide the advent of mature, well-formed, and business purpose workflows 15 and service enable these workflows 15 so that they can be consumed (utilized) by a standard mechanism. This becomes very valuable in a system which integrates many mission critical functionalities.
4. Better response time: The streamlined workflows 15 get executed much faster than normal (typical) in separate, individual, respective (manual for the user) scenarios.
5. Role based Access Control: Though technically the result of the activated workflow 15 could be consumed by anyone, only people playing certain roles within an organization can understand the workflow results. At the same time, those who understand the results need not know the inner workings of the other parts of the main simulation modeling application 13 or of the incorporating system 100. This way, the activated workflows 15 facilitate the implementation of role-based access control.
6. Increases Portability of solution: When "activated workflows" 15 are service enabled, the resultant service shall be rendered on multiple computer (client) systems.
7. Ease of Use: Non-technical user persons shall be able to explore the system 100 without the intervention of advanced users.
8. Enhanced User Experience: This provides sophisticated user experience and produces the answer at the single click of a button.
9. Actionable Guidance: After running the activated workflows 15, the system 100 provides actionable guidance which helps to optimize energy consumption (for example).

In example embodiments, context sensitive workflows 15 are dynamically generated by the invention system 100. For example, as pieces or modules are added to the main application 13 platform, the new piece or module may include additional workflows, input variables, and input parameters not previously available. In some embodiments, the one or more activated workflows 15 can be integrated into one or more applications 13. In some embodiments, the one or more activated workflows 15 involve turn taking (pauses integrated into the activated workflow, for example, for input variables, input parameters, or shared resources). In some embodiments, the variables and parameters in a given workflow 15 are populated based on the value of the previous step of the workflow. For example, additional input variables or input parameters of step 2 are populated against input variable/parameter values of step 1.

In some embodiments, workflows 15 may be dependent on availability of finite resources shared across different enterprise users. In some embodiments, additional workflows 15 compatible with current tasks may be temporarily available. In some embodiments, the activated workflows 15 might have compatibility but not resource availability. Activated workflow engine 100 manages workflows 15 taking into consideration compatibility and availability.

In some embodiments, the workflow 15 is multithreaded, i.e. contains one or more threads. In embodiments, workflow 15 steps may be run in a serial sequence or in a parallel sequence (multithread). In some embodiments, the workflow 15 may be scalable on one or more threads. In some embodiments, the system 100 uses multithread operations to implement some workflows 15. For example, when populating variables with respective values, the values are implemented by threads of a multithread workflow.

In some embodiments, multiple simultaneous modes of the main simulation application 13 may be running In some embodiments, multiple simultaneous modes of the activated workflow 15 may be running. For example, one mode may continually run the activated workflow 15 in the background (of a processor session) upon execution of the main simulation application 13. In some embodiments, the user may need to manually turn off the continuous mode of operation or the workflow will remain activated. In other embodiments, a mode may have a temporal component or launch at certain specified times, for example, requiring manual activation by the user, user-selected triggering, or event-specific triggering. For example, an activated workflow 15 for economics analysis may be run to evaluate costs of a modeled simulation process after one hour, one day, one week, or three months.

Figure 9:
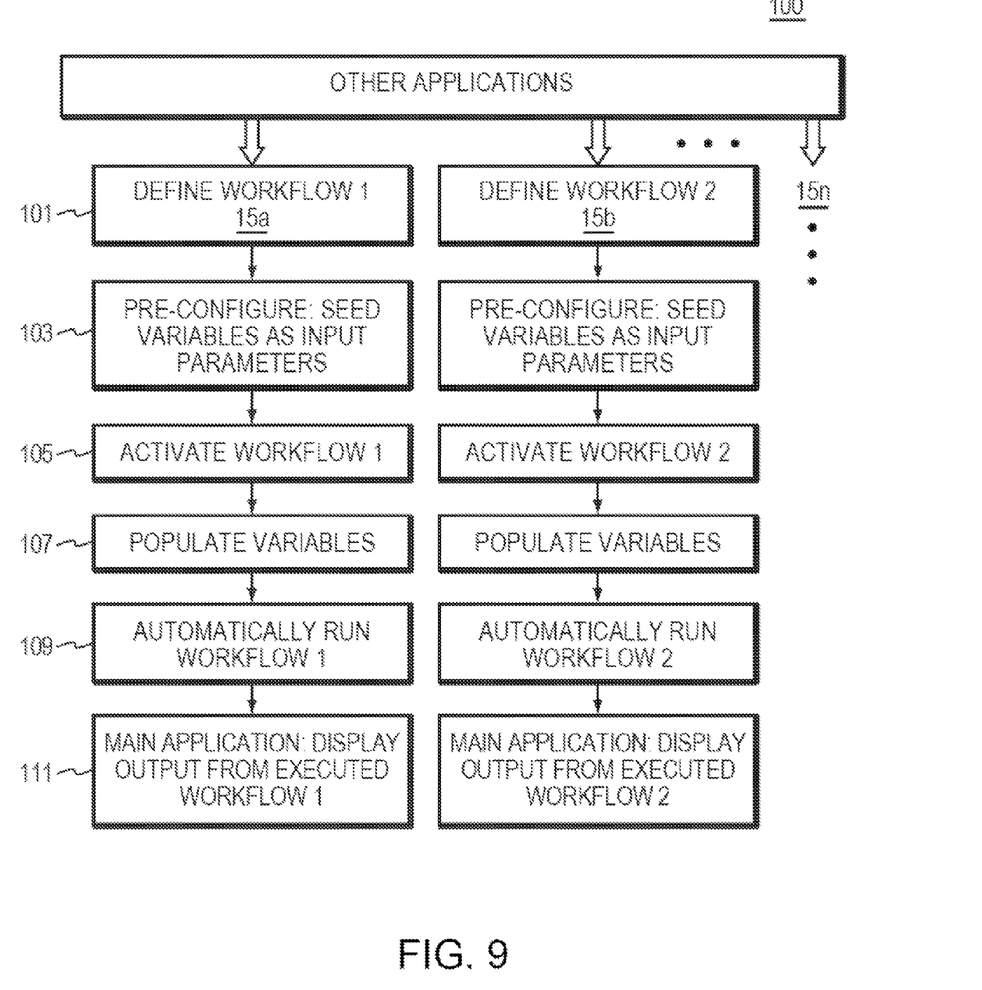
FIG. 9 is a flow diagram of the activated workflow engine operation in embodiments of the present invention.

FIG. 9 depicts the high level flow diagram of embodiments of the present invention. In the example embodiment of FIG. 1, a main application 13 (e.g., a simulation modeling application) is integrated with the associated workflows shown as 15a, b . . . n (generally 15) in invention system 100. A processor executes main application 13. Meanwhile, the invention system (activated workflow engine) 100 at step 101 defines one or more workflows 15 from applications 23 independent of the main application 13. To accomplish this, engine 100 stores state information of variables and data from applications 23. Based on this information, engine 100 orders the sequence of steps and maps the workflow schema for one or more workflows 15. For each workflow 15, component 103 of invention system 100 pre-configures the workflow by mapping input variables and input parameters of the workflow 15 to variables and parameters of the current context of simulation application 13. Further engine 100 (step 103) assigns values of variables/parameters of the simulation application 13 to seed input variables or set context/sensible default values as input parameters in respective workflows 15. Upon execution of the triggering transaction or event of the main application 13, the invention system 100 activates 105 the workflows 15 preferably in parallel. This is accomplished by step 107 populating the workflow input parameters and input variables with respective pertinent values as pre-configured to track (or map) with the context of simulation modeling application 13. In turn, step 109 independently runs the workflows 15 in parallel in an automated fashion. System 100 displays output results 111 of the executed workflows 15 in a graphical user interface of main application 13. In this way, one or more activated workflows 15 are defined, triggered and executed in parallel as applicable to simulation modeling main application 13 transactions and context.

EXAMPLES

Figure 11:
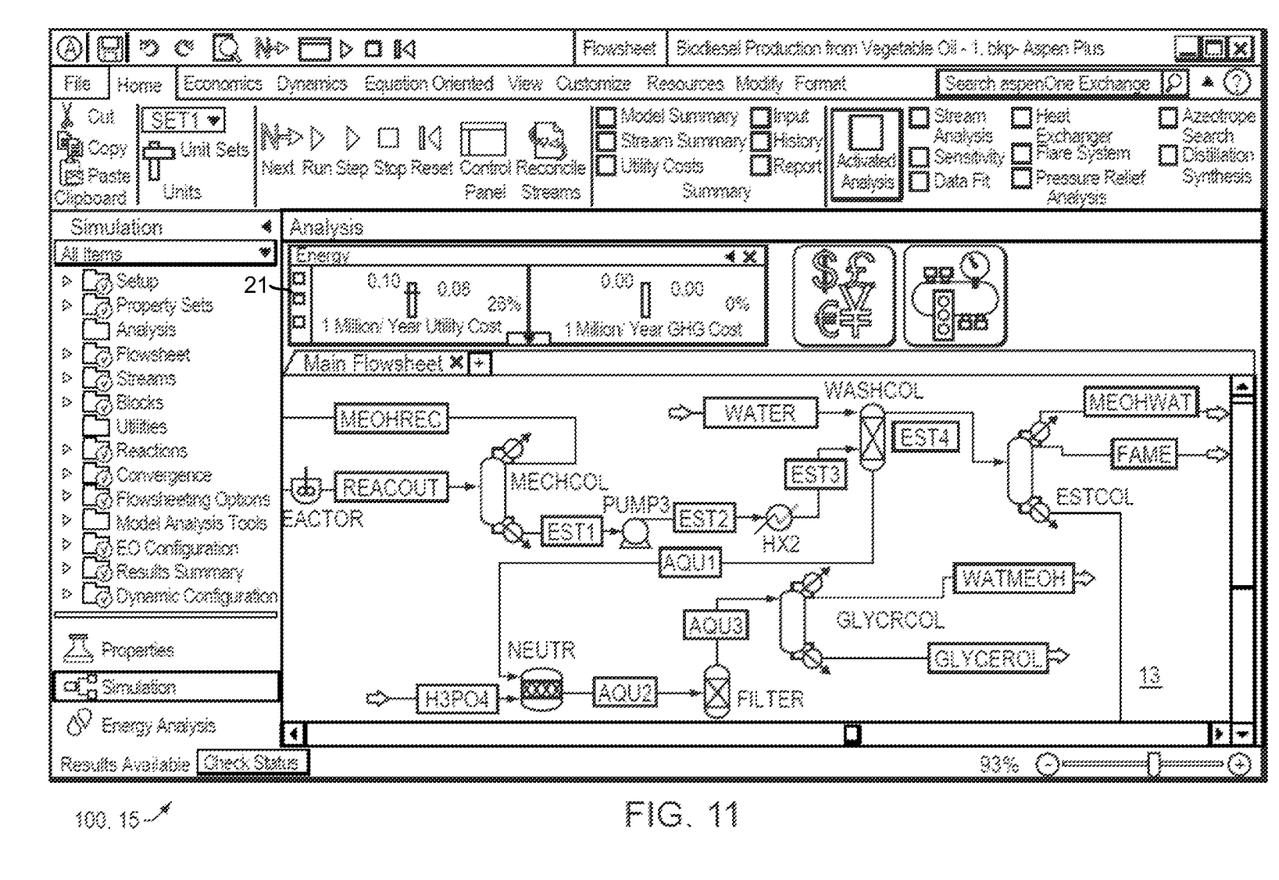
FIG. 11 is a schematic view of an example main application 13 and associated activated workflows for energy analytics, economic analysis, and heat exchanger design and rating with activated work flow for energy analytics invoked.

Scenario-1: Identify and Visualize the Scope for Energy Savings Using Activated Workflows With reference to FIGS. 2 and 11 the "activated workflow" 15 helps to identify energy savings on the fly with the help of an Energy Analysis dashboard 21. Each time the simulation (main application) 13 runs, the associated workflows 15 are activated and set up transactions are automatically run. In this example, the actual heating utility usage, cooling utility usage, and greenhouse gas generation are compared against theoretical limits. This is shown in the middle of the GUI screen view, and highlights the opportunities for energy savings. This saved a huge number of manual steps.

Figure 12:
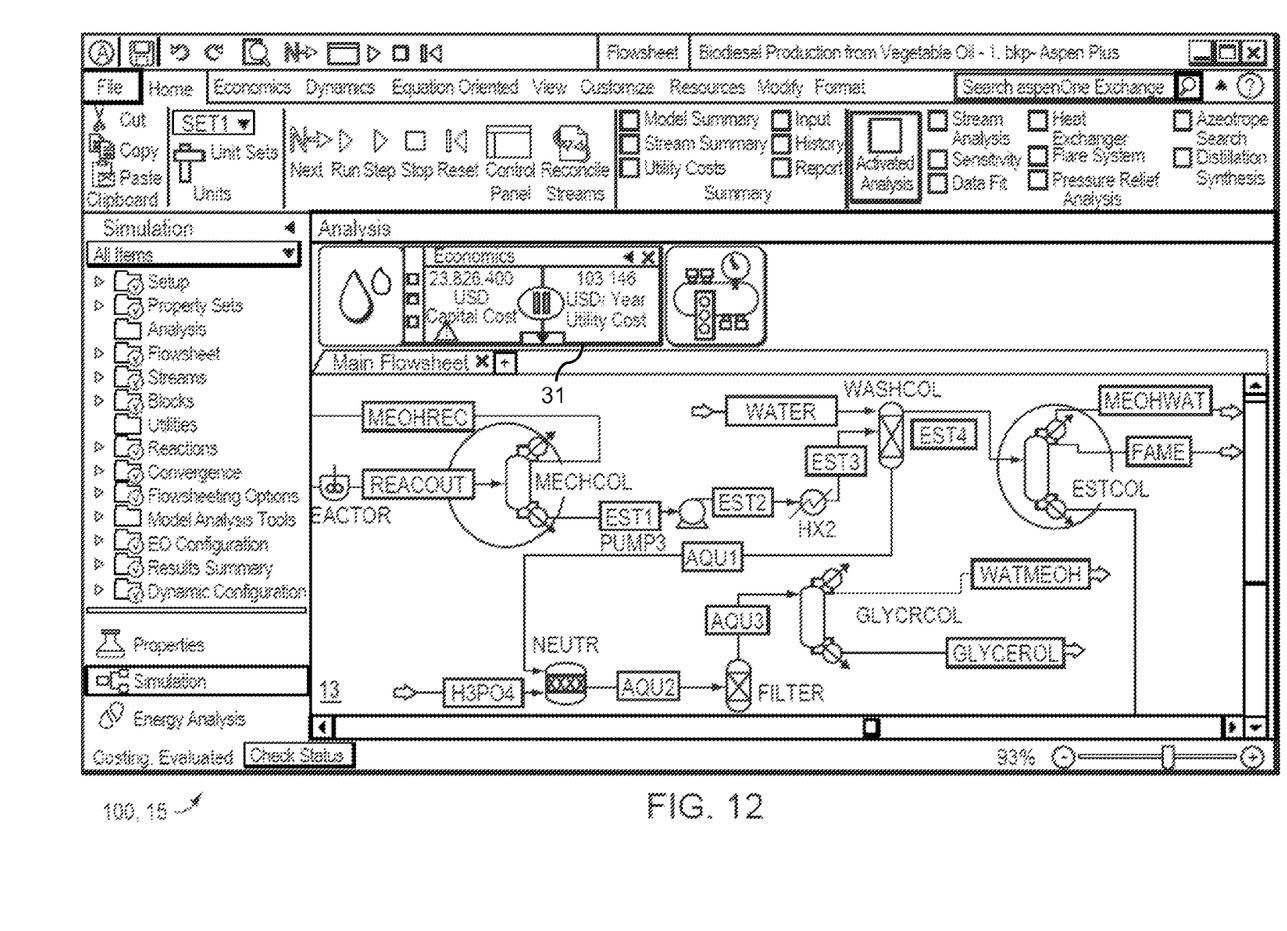
FIG. 12 is a schematic view of an example main application 13 and associated activated workflows for energy analytics, economic analysis, and heat exchanger design and rating with an activated workflow for economics analysis invoked.

Scenario-2: Identify and Visualize the Scope for Economics Analysis Using Activated Workflows In FIGS. 3 and 12, the "activated workflows" 15 are created and configured to make the Economic Dashboard 31 display capital and utility costs of a process design. The dashboard 31 updates automatically each time the model 13 is run, helping the user evaluate the relative cost of various designs. In this case as well, the set of associated transactions are run in a specific sequence as soon as the user runs the model 13. The dashboard 31 allows the user to drill down further to evaluate the costs of each equipment item and each type of utility. This triggers further transactions up stream.

Scenario-3: Increases Portability of the Activated Workflows

Figure 4:
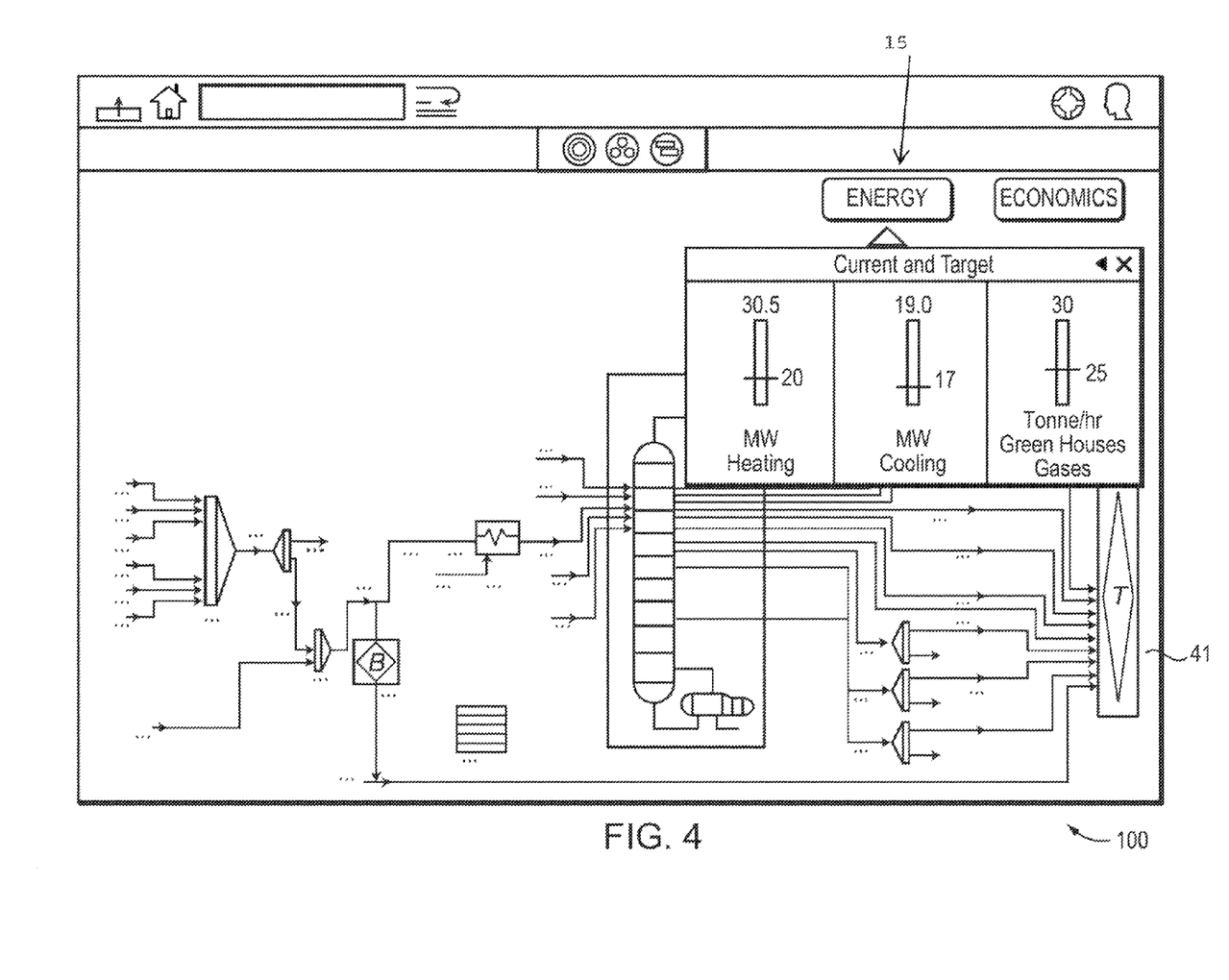
FIGS. 4 and 5 are schematic views of mobile or remote device graphical user interfaces of activated workflows in embodiments of the present invention.

As shown in FIG. 4, the workflows 15 are activated only once. When defined, the workflows 15 and resulting output can be consumed on other applications running on various tablet, mobile devices, and web applications. The image shown in FIG. 4 describes the simplified user interface 41 built on a device such as an Apple iPad (as trademarked) or Microsoft's Surface device. In this use case, an energy specialist (a professional playing the role as an energy engineer) logs on to the system 100 and directly fetches the "Energy Analysis" information (e.g., from energy dashboard 21 of FIG. 2 for example) without manually setting up more parameters, variables, and the like.

Figure 3:
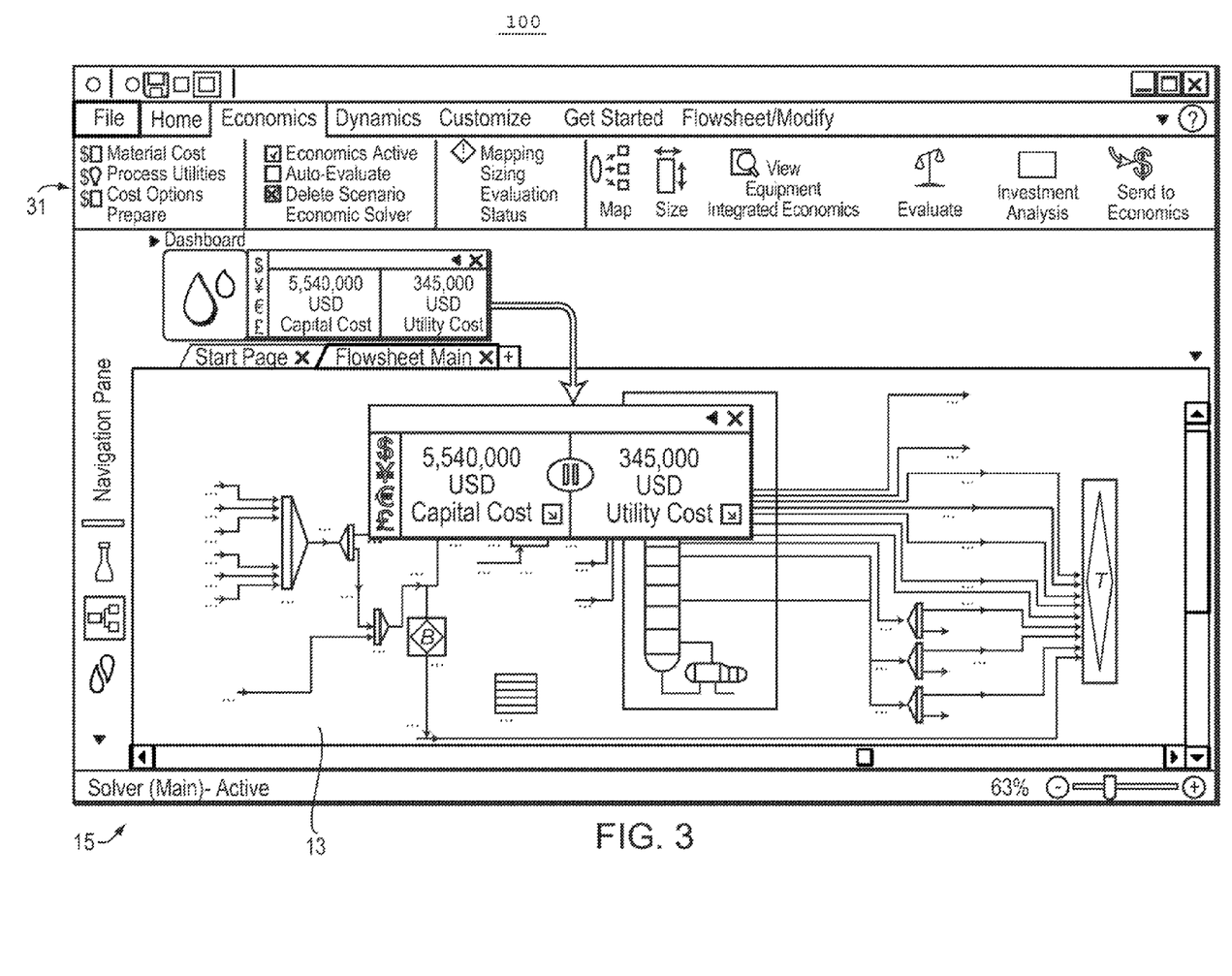
Figure 5:
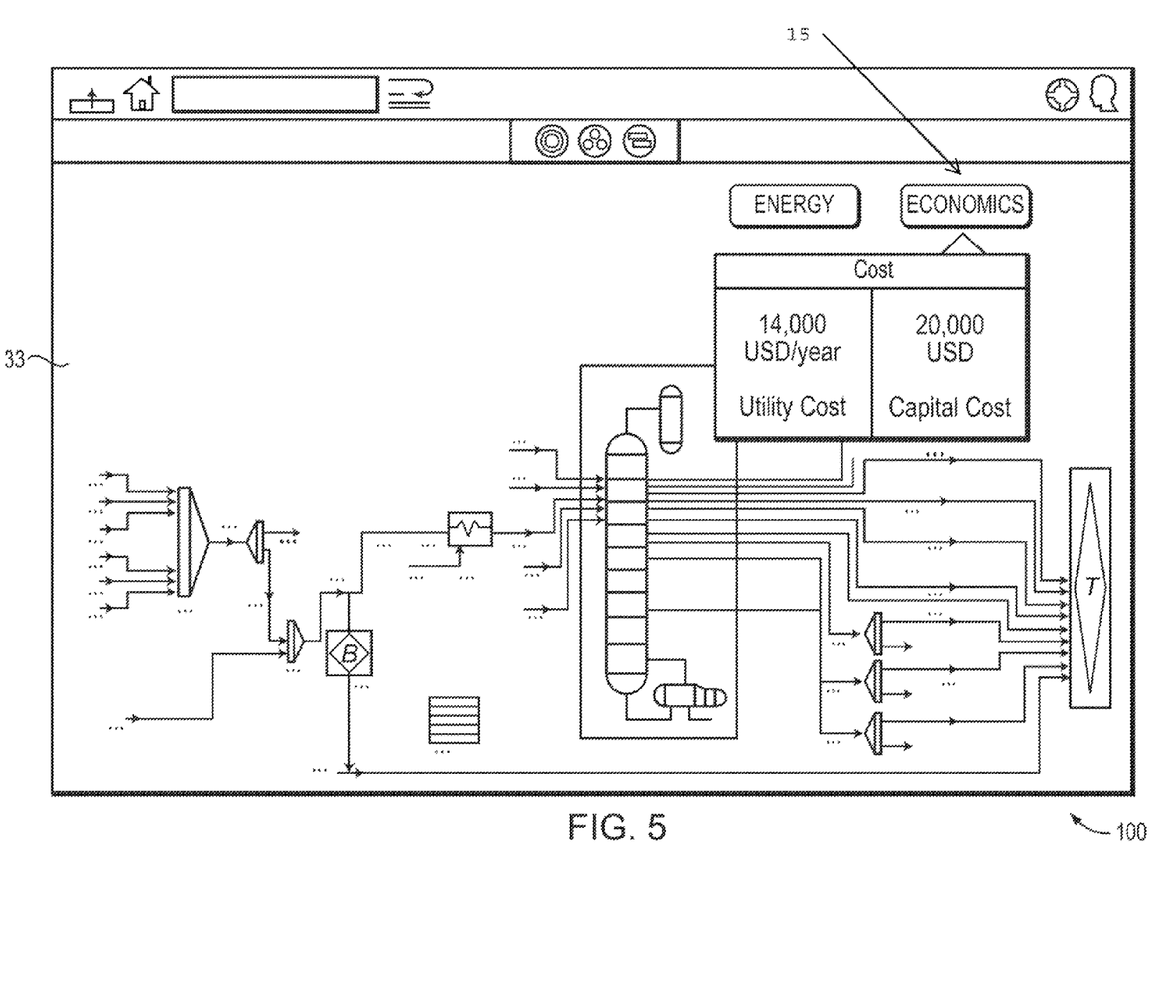

Similarly, FIG. 5 describes that a cost accountant (a person playing a specific role) shall logon to the system 100 just to invoke the "Economic Analysis" part 33 of the system to find the "Utility" and "Capital" from economic dashboard 31 of FIG. 3 for example. This professional need not know nuances of underlying complexities of the simulation 13 at all.

Figure 6:
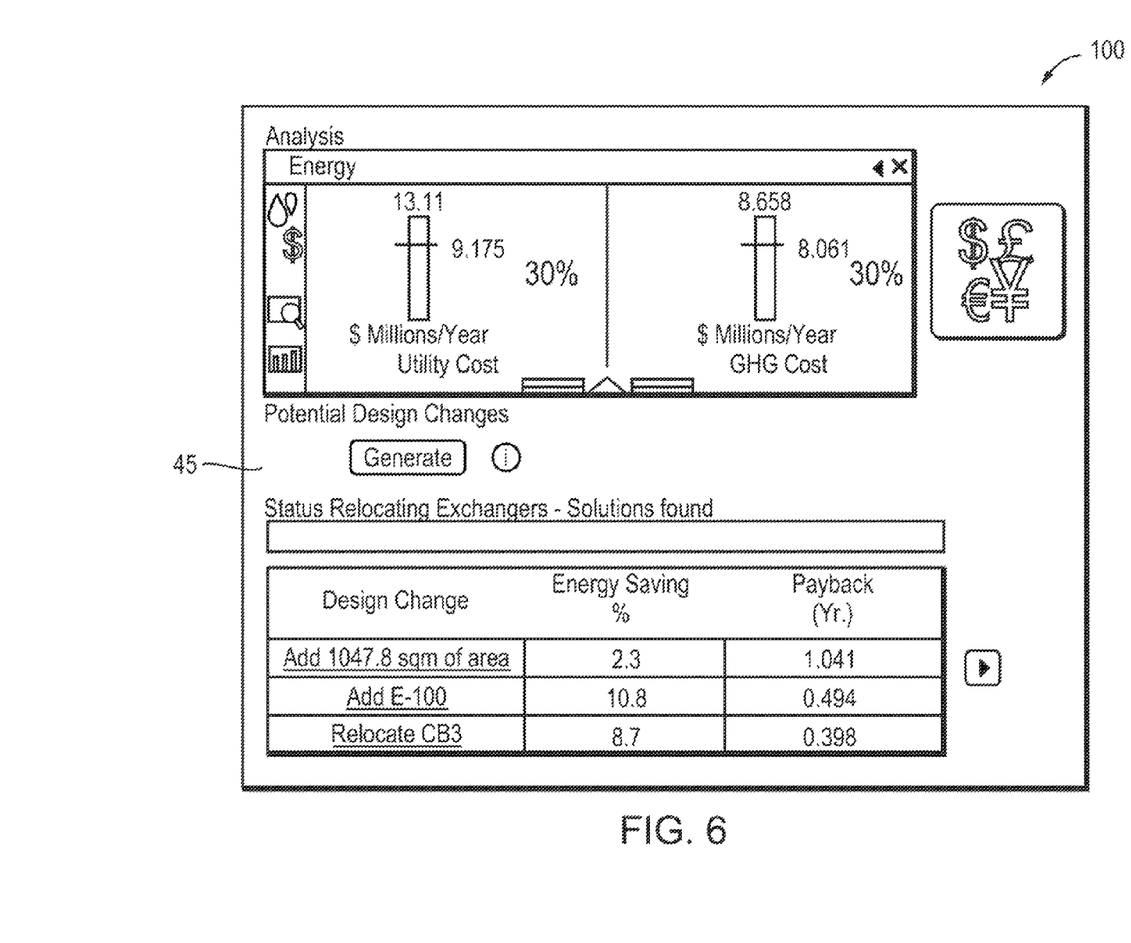
FIG. 6 is a schematic view of further output display features such as actionable guidance in embodiments of the present invention workflows.

When the activated workflows 15 are executed, the system 100 comes up with a list of actionable suggestions which will help the engineer (user) to optimize various parts of the system 100. FIG. 6 shows an example of further output display features such as actionable guidance 45 are rendered in one embodiment. Other graphics and visual output design and configurations are suitable.

Figure 10:
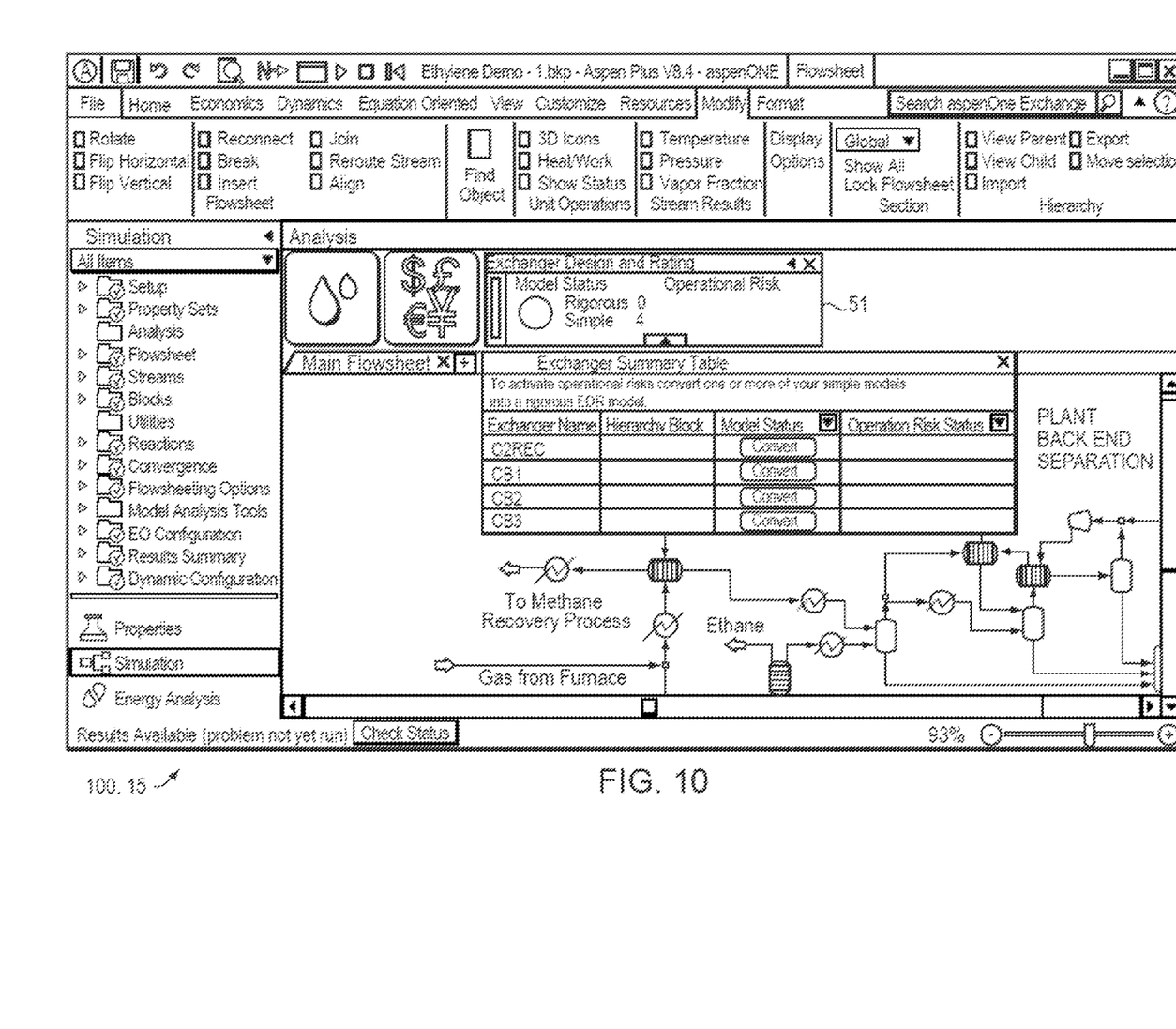
FIG. 10 is a schematic view of another example activated workflow for heat exchanger design and rating.

Scenario-4: Identify and Visualize the Scope for Heat Exchanger Design and Rating Using Activated Workflows:

In reference to FIG. 10, the "activated workflows" 15 are created and configured to make the Exchanger Design & Rating Dashboard 51 display model status and operational risk of a heat exchanger design and rating. The dashboard 51 updates automatically each time the model 13 is run, helping the user evaluate the model status and operational risk of various designs. In this case as well, the set of associated transactions are run in a specific sequence as soon as the user runs the model 13. The dashboard 51 allows the user to drill down further to evaluate the exchanger name, hierarchy block, model status, and operation risk status. This triggers further transactions up stream. The user can size heat exchangers and monitor performance directly from the flowsheet with the activated workflow focused on Exchanger Design & Rating. With rigorous heat exchanger models, the user can streamline exchanger design, monitor operational performance, and avoid costly operational problems.

A schematic view of an example main application 13 and associated activated workflows 15 for energy analytics, economic analysis, and heat exchanger design and rating can be displayed while modeling is being performed. For example, the activated work flow 15 for energy analytics (FIG. 11) can be expanded to evaluate details of the actual utility cost and greenhouse gas generation cost for the model 13, and the model 13 can further be optimized based on these parameters. Additionally, the activated work flow 15 for energy analytics can be used to compare actual heating and cooling utilities against targets to identify design improvements, track greenhouse gas emissions and costs, and forecast utility expenditures.

Likewise a schematic view of an example main application 13 with an activated workflow for economics analysis (FIG. 12) can be expanded to evaluate the Utility and Capital in the economics dashboard while modeling is being performed.

In any computer based business application, workflow is an integral part of the system. Applicant has developed an activated workflow engine technology to automate the delivery of basic process engineering optimization and decision support functionality. This significantly reduces the required human intervention, reduces the margin of error, and facilitates an automated and activated workflow paradigm where cost, time, efficiency, and accuracy are important factors in arriving at a decision.

Moreover, the present invention has the ability to create the activated workflows 15 and provides the ability to run them automatically when a parent level functionality (such as main application 13 or transaction therein) gets executed. Before this invention, software applications would launch these functionalities as independent programs (silos) and users would be suddenly directed to a completely different application and interface where they would need to start from the beginning and input data manually. With embodiments 100 of the present invention, one can achieve visual consistency by implementing activated workflows 15 and running them from the main program 13 (including user interface thereof) itself.

By virtue of providing two way communications to the end user, the activated workflows 15 help to (a) elevate the inherent business value of the main software application 13, (b) provide better response times, (c) implement role-based access control, (d) enhance user experience, and (e) increase the feedback loop by providing valuable suggestions and guidance.

Computer Support

Figure 7:
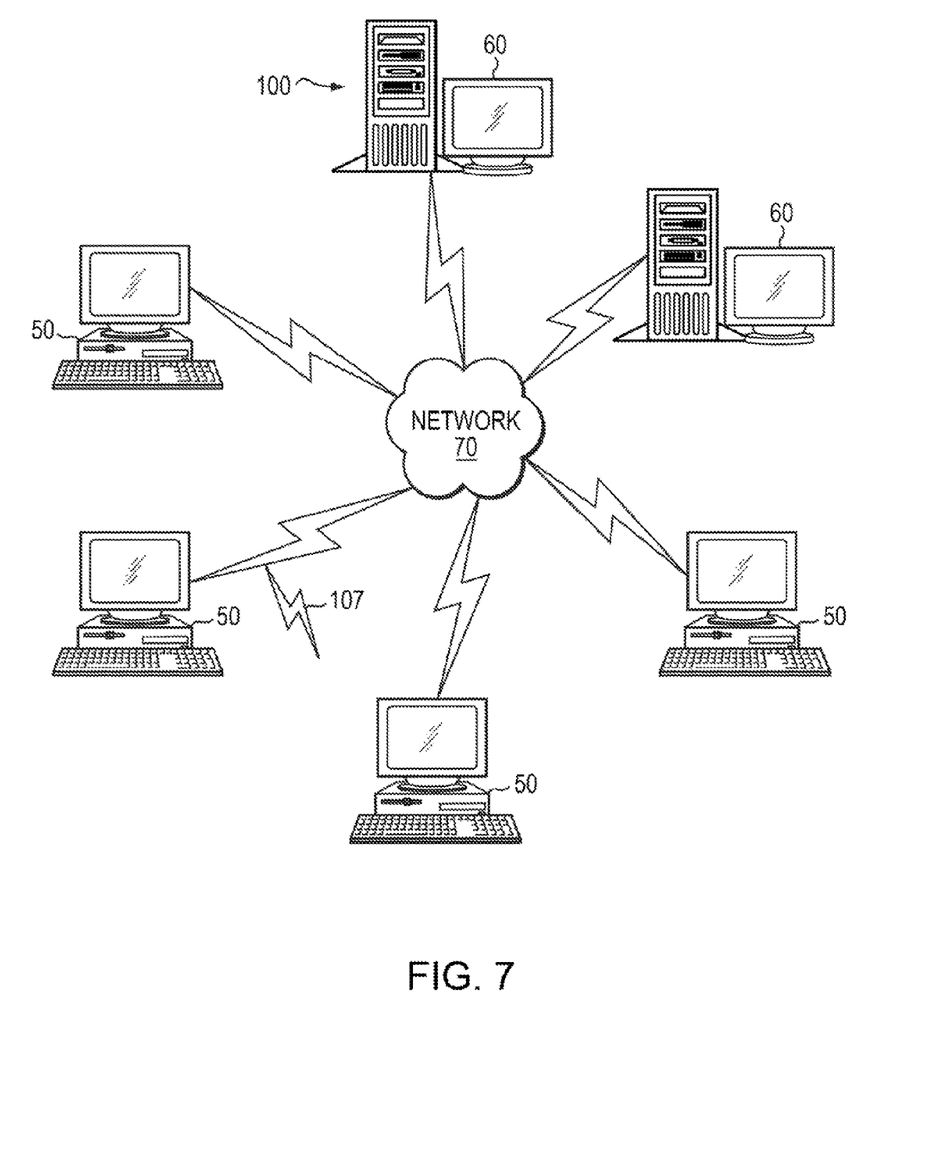
FIG. 7 is a computer network in which embodiments of the present invention are deployed.

FIG. 7 illustrates a computer network or similar digital processing environment in which embodiments of the present invention (activated workflow engine and method) may be implemented.

Client computer(s)/devices 50 and server computer(s) 60 provide processing, storage, and input/output devices executing application programs and the like. Client computers/devices 50 may be for example desktops, laptops, mobile devices and so forth. The executed application programs are, for non-limiting example, the simulation modeling application 13 and integrated relevant applications described above.

Client computer(s)/devices 50 can also be linked through communications network 70 to other computing devices, including other client devices/processes 50 and server computer(s) 60. Communications network 70 can be part of a remote access network, a global network (e.g., the Internet), a worldwide collection of computers, Local area or Wide area networks, and gateways that currently use respective protocols (TCP/IP, Bluetooth, etc.) to communicate with one another. Other electronic device/computer network architectures are suitable.

Figure 8:
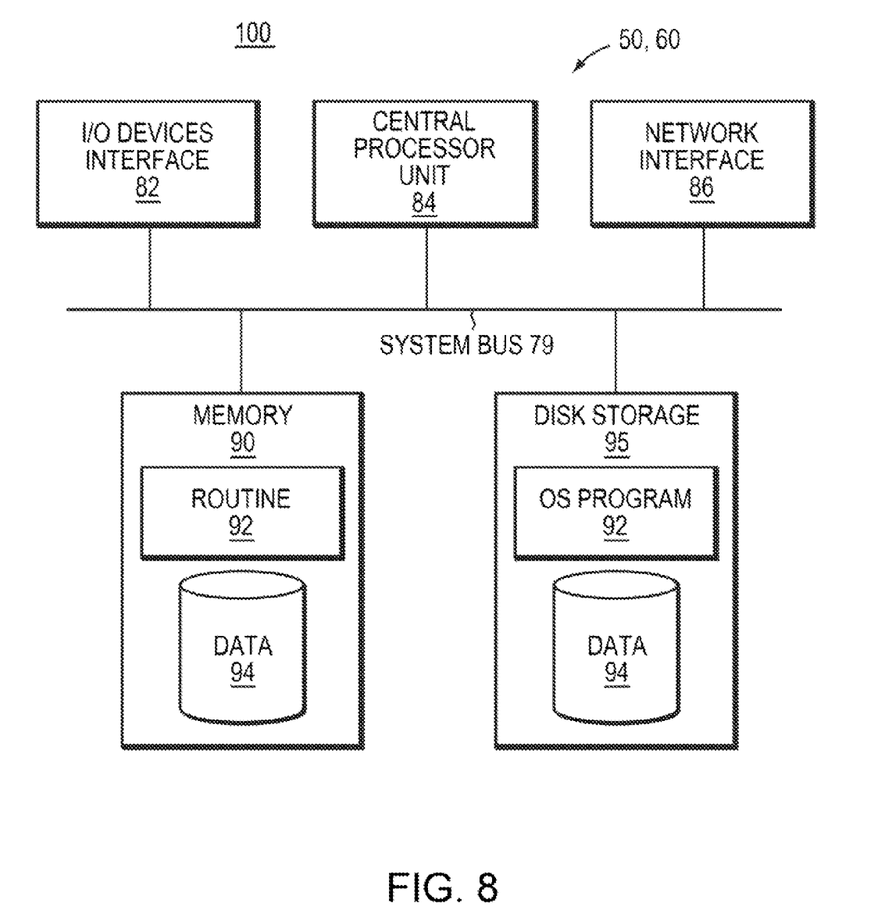
FIG. 8 is a computer node, such as a mobile device, portable processor, client or server, in the computer network of FIG. 7.

FIG. 8 is a diagram of the internal structure of a computer (e.g., client processor/device 50 or server computers 60) in the computer system of FIG. 7. Each computer 50, 60 contains system bus 79, where a bus is a set of hardware lines used for data transfer among the components of a computer or processing system. Bus 79 is essentially a shared conduit that connects different elements of a computer system (e.g., processor, disk storage, memory, input/output ports, network ports, etc.) that enables the transfer of information between the elements. Attached to system bus 79 is I/O device interface 82 for connecting various input and output devices (e.g., keyboard, mouse, displays, printers, speakers, etc.) to the computer 50, 60. Network interface 86 allows the computer to connect to various other devices attached to a network (e.g., network 70 of FIG. 7). Memory 90 provides volatile storage for computer software instructions 92 and data 94 used to implement an embodiment of the present invention (e.g., activated workflow engine at 100 and supporting code detailed above). Disk storage 95 provides non-volatile storage for computer software instructions 92 and data 94 used to implement an embodiment of the present invention. Central processor unit 84 is also attached to system bus 79 and provides for the execution of computer instructions.

Figure 2:
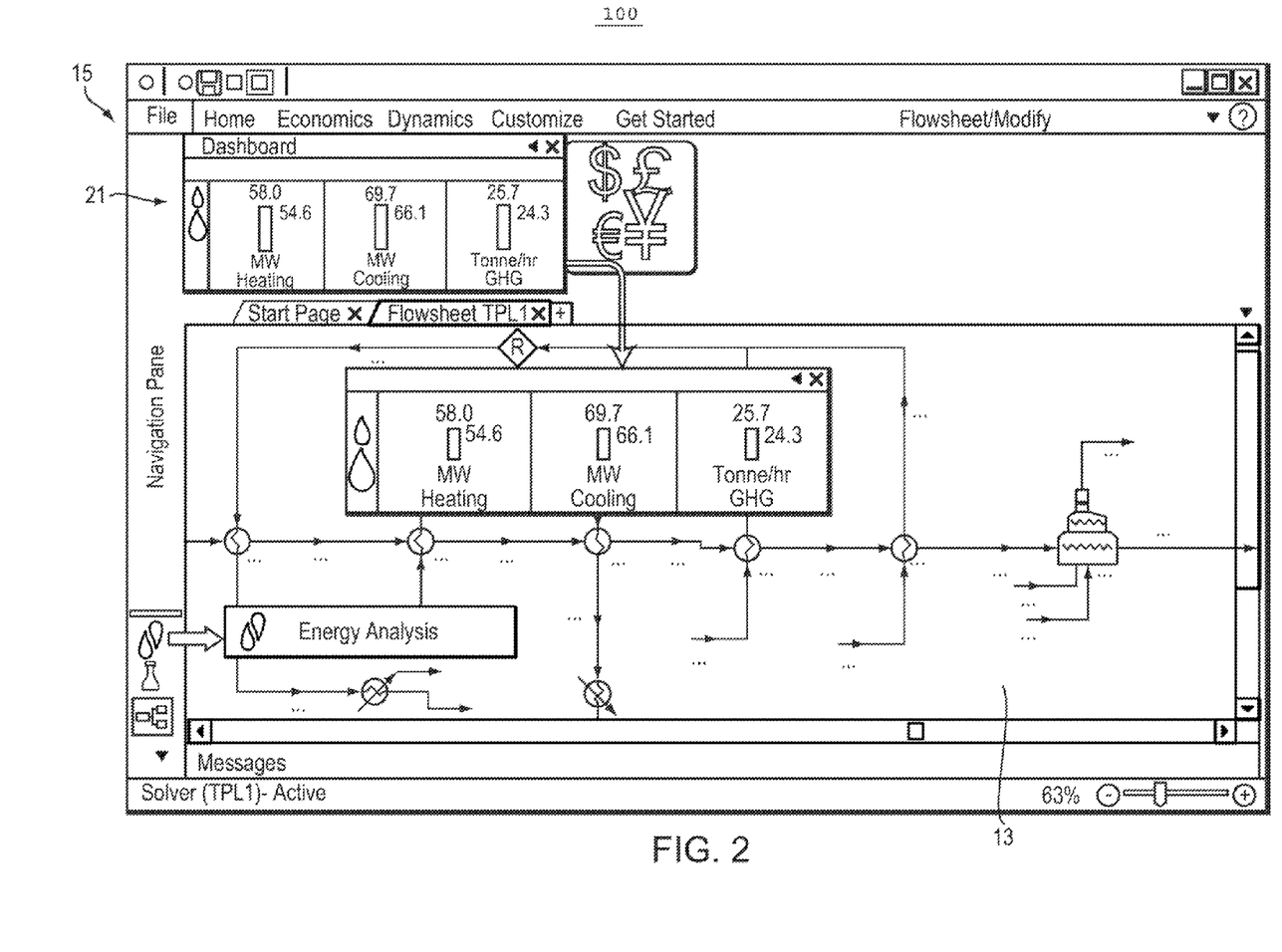

In some embodiments, system 100 variables and parameters involved in key inputs and outputs of activated workflows 15 are stored in data 94. Example functional data structures for configuring data 94 are provided below:

From Simulation 13 to Activated Energy Analysis (Supporting Dashboard 21 Element):
1. Unit operation definition
2. Connectivity between unit operations including Heat Exchanger Network connectivity
3. Heating and cooling temperature profile in heat exchangers and energy intensive unit operations
4. Heat duties for heat exchange duties
5. Utilities used (temperature profile and current duties)
6. Utility costs per unit usage
7. Minimum temperature difference for the process From Activated Energy Analysis to Simulation 13:
1. Minimum heating and cooling energy consumption for the Process
2. Minimum Energy cost for the process
3. Target utility consumption for each of the utilities
4. Specific Opportunities for design change
   a. New Heat exchanger—location and duty
   b. Re-pipe of a heat exchanger
   c. Adding area to an existing heat exchanger
5. Minimum greenhouse gas consumption for the process From Simulation 13 to Activated Economic Analysis 33 (Supporting dashboard 31):
1. Unit operation definition
2. Process flows, temperatures and pressures
3. Equipment sizing available from simulation
4. Connectivity between unit operations
5. Utilities used (temperature profile and current duties)
6. Raw Materials, Products and Utility costs per unit consumption
7. Region for operation
8. Materials of construction if not standard From Activated Economic Analysis 33 to Simulation 13:
1. Overall Capital and Operating Costs
2. Plant Profitability
3. Equipment costs
4. Equipment weight
5. Equipment size
6. Materials of construction
7. Project Pay back and Internal Rate of Return In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 can be installed by any suitable software installation procedure, as is well known in the art. In another embodiment, at least a portion of the software instructions may also be downloaded over a cable, communication and/or wireless connection. In other embodiments, the invention programs are a computer program propagated signal product 107 embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 50 may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method of simulation modeling comprising:
    providing a simulation modeling application executable on a processor;
    automatically defining, by a computer, one or more workflows from applications independent of the simulation modeling application but integrated therewith;
    pre-configuring the workflows by the computer seeding variables as input parameters in respective workflows;
    upon execution of the simulation modeling application, by the processor, the computer: (i) automatically activating the workflows, (ii) automatically populating the variables with corresponding input parameter values, and (iii) independently running the workflows in parallel in an automated fashion; and
    displaying output results of the executed workflows in a graphical user interface of the simulation modeling application,
    wherein the workflows are multithreaded to execute in both a serial sequence and a parallel sequence.

2. A method as claimed in claim 1 wherein each workflow is a respective set of one or more interconnected steps or mechanisms.

3. A method as claimed in claim 1 wherein activating the workflows includes validating activated state of the workflows and putting the validated workflows in a ready-to-run state.

4. A method as claimed in claim 1 further comprising:
    from a performing transaction, the computer gathering information from context of the transaction; and
    from the gathered information, the computer assigning appropriate values to the variables such that the variables serve as input parameters that suit the respective workflows that are applicable to the transaction.

5. A method as claimed in claim 4 further comprising:
    associating, by the computer, the workflows with the transaction and with the simulation modeling application.

6. A method as claimed in claim 4 wherein the variables are populated with the assigned values.

7. A method as claimed in claim 4 wherein the workflows are dynamically generated.

8. A method as claimed in claim 1 wherein the workflows are dependent on availability of finite resources shared across different users.

9. A method as claimed in claim 1 wherein running the workflows is selected from one of the following modes: continuous, user-selected triggering, or event-specific triggering.

10. A method as claimed in claim 1 wherein the results of the executed workflows are displayed in the graphical user interface of the simulation modeling application in a manner viewable on more than one device.

11. A method as claimed in claim 1 wherein upon execution of the simulation modeling application, a set of associated transactions is run in a specific sequence.

12. A method as claimed in claim 11 further comprising evaluating variables and triggering additional transactions up stream in the sequence.

13. A method as claimed in claim 1, the pre-configuring of the workflows by the computer seeding variables further comprising assigning the computer seeding variables based on at least one of: context of the simulation modeling application, stored data associated with the workflows, and logic or rules of one or more routines of the processor.

14. A method as claimed in claim 1, further comprising providing bidirectional communication of the workflows between the simulation modeling application and an end user, the bidirectional communication including: (i) a feedback loop and (ii) actionable suggestions or guidance to the end user to optimize one or more portions of the simulation modeling application.

15. A method as claimed in claim 1, wherein the executed workflows include actual data and target data, the actual data and the target data being associated with at least one of the input parameters, and wherein the computer further: (i) performs a comparison between the actual data and the target data, and (ii) responsively displays to an end user the actual data and the target data concurrently.

16. A computer system for simulation modeling comprising:
    at least one processor and associated memory configured to implement:
    a simulation modeling module executable by a processor and providing a simulation modeling application; and
    an activated workflow engine executable by a computer and automatically defining one or more workflows from applications independent of the simulation modeling application but integrated therewith;

the activated workflow engine pre-configuring the workflows by seeding variables as input parameters in respective workflows;

upon processor execution of the simulation modeling application, the activated workflow engine: (i) automatically activating the workflows, (ii) automatically populating the variables with corresponding input parameter values, and (iii) independently running the workflows in parallel in an automated fashion;

wherein the simulation modeling application has a graphical user interface, and results of the executed workflows are displayed in the graphical user interface of the simulation modeling application, and wherein the workflows are multithreaded to execute in both a serial sequence and a parallel sequence.

17. A computer system as claimed in claim 16 further comprising:

from a performing transaction, the activated workflow engine gathering information from context of the transaction; and from the gathered information, the activated workflow engine assigning appropriate values to the variables such that the variables serve as input parameters that suit the respective workflows that are applicable to the transaction.

18. A computer system as claimed in claim 17 wherein the activated workflow engine populates the variables with the assigned values.

19. A computer program product providing a simulation modeling method comprising:

a non-transitory computer useable medium having a computer readable program;

wherein the computer readable program when executed on a computer causes one or more computers to:

provide a simulation modeling application executable on a processor;

automatically define one or more workflows from applications independent of the simulation modeling application but integrated therewith;

pre-configure the workflows by seeding variables as input parameters in respective workflows;

upon execution of the simulation modeling application: (i) automatically activate the workflows, (ii) automatically populate the variables with corresponding input parameter values, and (iii) independently run the workflows in parallel in an automated fashion; and display output results of the executed workflows in a graphical user interface of the simulation modeling application, wherein the workflows are multithreaded to execute in both a serial sequence and a parallel sequence.

20. A computer program product as claimed in claim 19 wherein the computer readable program when executed on a computer further causes one or more computers to:

from a performing transaction, gather information from context of the transaction; and from the gathered information, assign appropriate values to the variables such that the variables serve as input parameters that suit the respective workflows that are applicable to the transaction.

21. A computer program product as claimed in claim 20 wherein the variables are populated with the assigned values.

* * * * *